(12) United States Patent
Heinemann et al.

(10) Patent No.: US 7,637,009 B2
(45) Date of Patent: Dec. 29, 2009

(54) APPROACH FOR FABRICATING PROBE ELEMENTS FOR PROBE CARD ASSEMBLIES USING A REUSABLE SUBSTRATE

(75) Inventors: Keith Heinemann, Mesa, AZ (US); Jamin Ling, Scottsdale, AZ (US); Richard McCullough, Chandler, AZ (US); Brian McHugh, Phoenix, AZ (US); Jordan Lane Wahl, Mesa, AZ (US)

(73) Assignee: SV Probe Pte. Ltd., Singapore (SG)

( * ) Notice: Subject to any disclaimer, the term of this patent is extended or adjusted under 35 U.S.C. 154(b) by 1 day.

(21) Appl. No.: 11/711,578

(22) Filed: Feb. 26, 2007

(65) Prior Publication Data

US 2007/0222466 A1 Sep. 27, 2007

Related U.S. Application Data

(60) Provisional application No. 60/777,186, filed on Feb. 27, 2006.

(51) Int. Cl.
  *H01R 43/16* (2006.01)
(52) U.S. Cl. .............................. 29/874; 29/831; 29/884; 324/754
(58) Field of Classification Search .................... 29/825, 29/842, 874, 876, 884, 739, 762, 831, 846, 29/848; 205/135, 152, 154; 438/597; 324/754
See application file for complete search history.

(56) References Cited

U.S. PATENT DOCUMENTS 5,197,184 A * 3/1993 Crumly et al. ................. 29/846
5,207,887 A * 5/1993 Crumly et al. ................. 205/78
5,426,850 A * 6/1995 Fukutomi et al. ............. 29/848
6,230,402 B1 * 5/2001 Sexton et al. .................. 29/846

(Continued)

FOREIGN PATENT DOCUMENTS

EP 1 519 414 A1 3/2005

OTHER PUBLICATIONS

European Patent Office, "Notification of Transmittal of the International Search Report and the Written Opinion of the International Searching Authority, or the Declaration", International application No. PCT/US2007/005144, dated Sep. 5, 2007, 11 pages.

(Continued)

*Primary Examiner*—Donghai D. Nguyen
(74) *Attorney, Agent, or Firm*—Hickman Palermo Troung & Becker LLP

(57) ABSTRACT

An approach is provided for fabricating probe elements for probe card assemblies. Embodiments of the invention include using a reusable substrate, a reusable substrate with layered probe elements and a reusable substrate with a passive layer made of a material that does not adhere well to probe elements formed thereon. Examples of probe elements include, without limitation, a cantilever probe element, a vertically-oriented probe element, and portions of probe elements, e.g., a beam element of a cantilever probe element. Probe elements, or portions of probe elements, may be formed using any of a number of electroforming or plating processes such as, for example, plating using masking techniques, e.g., using lithographic techniques such as photolithography, stereolithography, X-ray lithography, etc.

15 Claims, 3 Drawing Sheets

U.S. PATENT DOCUMENTS

| | | | |
|---|---|---|---|
| 6,255,126 B1 * | 7/2001 | Mathieu et al. | 438/597 |
| 6,398,561 B1 * | 6/2002 | Okuno et al. | 29/831 |
| 6,872,453 B2 * | 3/2005 | Arnaud et al. | 428/432 |
| 6,998,032 B2 * | 2/2006 | De Nora et al. | 204/293 |
| 2002/0031921 A1 * | 3/2002 | Okuno et al. | 439/55 |
| 2003/0143772 A1 * | 7/2003 | Chen | 438/47 |
| 2005/0250310 A1 * | 11/2005 | Ogawa | 438/622 |
| 2005/0253618 A1 * | 11/2005 | Howland et al. | 324/765 |
| 2005/0255408 A1 * | 11/2005 | Grube et al. | 430/311 |
| 2005/0271832 A1 * | 12/2005 | Goto | 428/1.1 |
| 2005/0280027 A1 * | 12/2005 | Ikeda et al. | 257/192 |
| 2007/0103177 A1 * | 5/2007 | Chen | 324/754 |
| 2007/0243414 A1 * | 10/2007 | Miki | 428/699 |

OTHER PUBLICATIONS

Claims, International application No. PCT/US2007/005144, 3 pages.

* cited by examiner

APPROACH FOR FABRICATING PROBE ELEMENTS FOR PROBE CARD ASSEMBLIES USING A REUSABLE SUBSTRATE

RELATED APPLICATION DATA AND CLAIM OF PRIORITY

This application claims the benefit of, and priority to, U.S. Provisional Patent Application No. 60/777,186, entitled PLATING OF PROBE ELEMENTS ON A REUSABLE SUBSTRATE, filed Feb. 27, 2006, the contents of which are incorporated by reference for all purposes as if fully set forth herein.

FIELD OF THE INVENTION

This invention relates generally to the fabrication of probe elements for probe card assemblies.

BACKGROUND

The approaches described in this section are approaches that could be pursued, but not necessarily approaches that have been previously conceived or pursued. Therefore, unless otherwise indicated, the approaches described in this section may not be prior art to the claims in this application and are not admitted to be prior art by inclusion in this section.

In the testing of wafer-based semiconductor devices, probe cards are typically used to provide electrical interconnection between a testing system and the semiconductor wafer. Such probe cards may, for example, include a printed circuit board (i.e., PCB), a probe substrate, and an interposer, e.g., a pogo pin or spring pin based interposer) providing electrical interconnection between the PCB and the probe substrate. Resilient probe elements are supported by the probe substrate. For example, in certain probe cards, the probe elements may be held in a "floating" configuration within a probe head adjacent the probe substrate. In other probe cards, the probe elements may be fixed at one end to a conductive region, e.g., a conductive trace, a terminal, a lead, a contact pad, etc.) of the probe substrate.

Probe elements may have different configurations, depending upon the testing application. For example, cantilever style probes are sometimes used in the testing of memory devices. Vertically configured probes, e.g., probe needles) are often used in tighter pitch probe cards, such as area array configurations.

Probe elements may be fabricated using a wide variety of techniques. For example, probe elements may be fabricated using semiconductor fabrication masking techniques. This may include forming probe elements on a sacrificial substrate that is destroyed after the probe elements are formed to separate the probe elements from the substrate. An alternative is to first form a release layer, such as a thin copper layer, on a substrate and then form the probe elements on the release layer using masking techniques. After the probe elements are formed, the release layer is destroyed, for example by etching, to release the probe elements from the substrate.

BRIEF DESCRIPTION OF THE DRAWINGS

In the figures of the accompanying drawings like reference numerals refer to similar elements.

DETAILED DESCRIPTION

An approach is provided for fabricating probe elements for probe card assemblies. The approach is applicable to any type of probe element. Embodiments of the invention include using a reusable substrate, a reusable substrate with layered probe elements and a reusable substrate with a passive layer made of a material that does not adhere well to probe elements formed thereon. Examples of probe elements include, without limitation, a cantilever probe element, a vertically-oriented probe element, and portions of probe elements, e.g., a beam element of a cantilever probe element. Probe elements, or portions of probe elements, may be formed using any of a number of electroforming or plating processes such as, for example, plating using masking techniques, e.g., using lithographic techniques such as photolithography, stereolithography, X-ray lithography, etc. Embodiments of the invention include using a reusable substrate, a reusable substrate with layered probe elements and a reusable substrate with a passive layer made of a material that does not adhere well to probe elements formed thereon.

Figure 1:
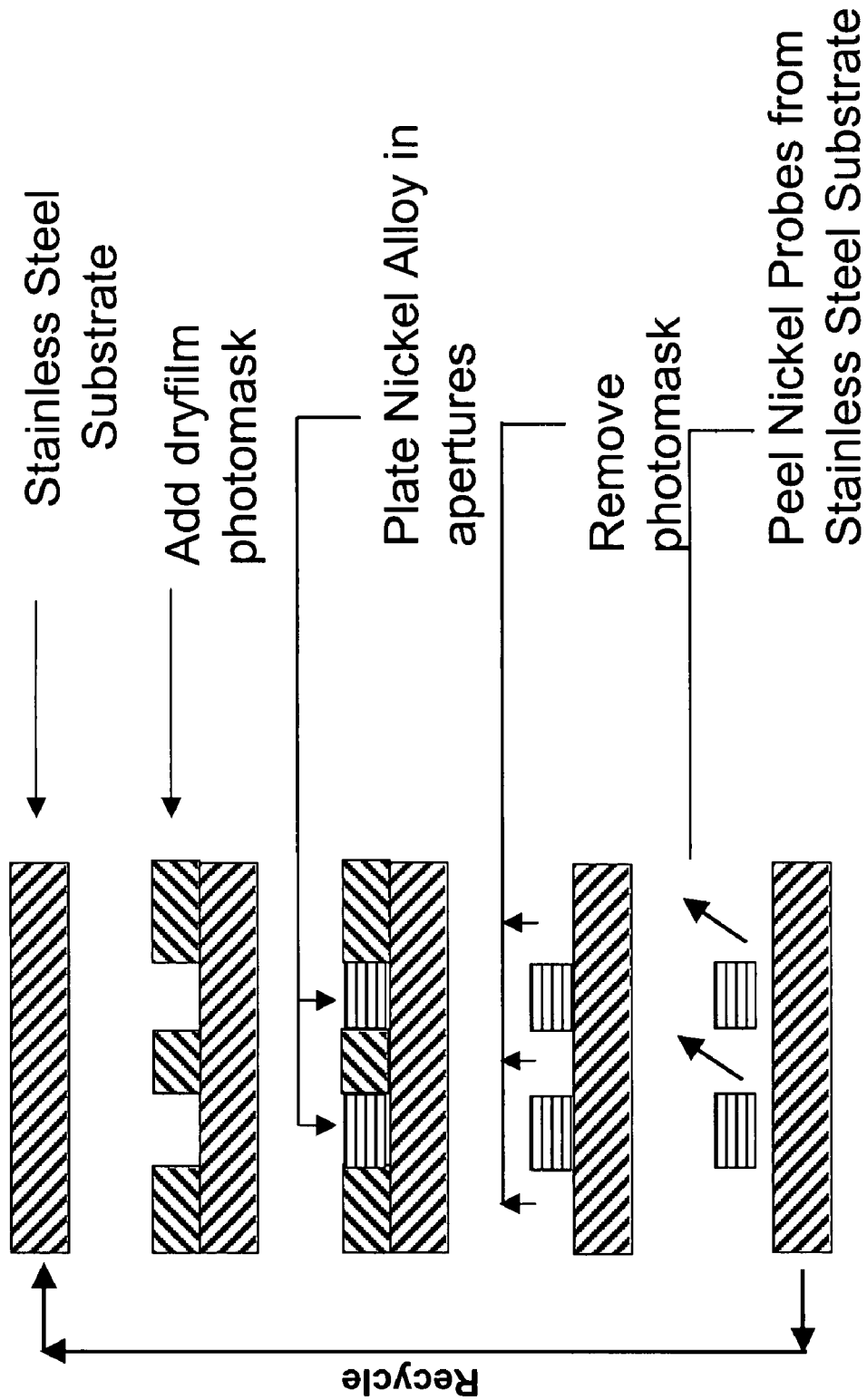
FIG. 1 depicts an approach for fabricating probe elements using a reusable substrate, according to one embodiment of the invention.

FIG. 1 depicts an approach for fabricating probe elements using a reusable substrate, according to one embodiment of the invention. As depicted in FIG. 1, a photomask is applied to the surface of a reusable substrate, where the photomask defines apertures. For purposes of explanation, embodiments of the invention are depicted in the figures and described herein in the context of a dryfilm photomask, but the invention is not limited to the context of a dryfilm photomask, and other types of photomasks may be used. Also for purposes of explanation, embodiments of the invention are depicted in the figures and described herein in the context of a reusable substrate comprising a stainless steel substrate, but the invention is not limited to a reusable substrate made of stainless steel and other materials may be used. Examples of other materials include, without limitation, silicon, nickel, titanium, other metal materials and ceramic materials. At the next step, a nickel alloy, e.g., NiMn or any other suitable conductive material, is plated in the apertures of the photomask. At the next step, the photomask is removed, e.g., by immersion in a chemical photoresist stripper, after which the substrate, including the probe elements, may be desirably rinsed and dried. At the next step, the probe elements, e.g., configured in a probe panel connected to one another using plated tie bars or the like, are removed from the stainless steel substrate. No release layer is applied to the surface of the stainless steel substrate. After the probe elements, e.g., in the probe element panel, are removed from the substrate, the stainless steel substrate is reusable, as indicated by the recycle annotation.

After being removed from the stainless steel substrate, the probe elements are then ready for further processing, which may include further cleaning, e.g., plasma cleaning, and applying a conductive coating, e.g., gold, to the probe elements, and singulating the probe elements for assembly in conjunction with a probe card.

Figure 2:
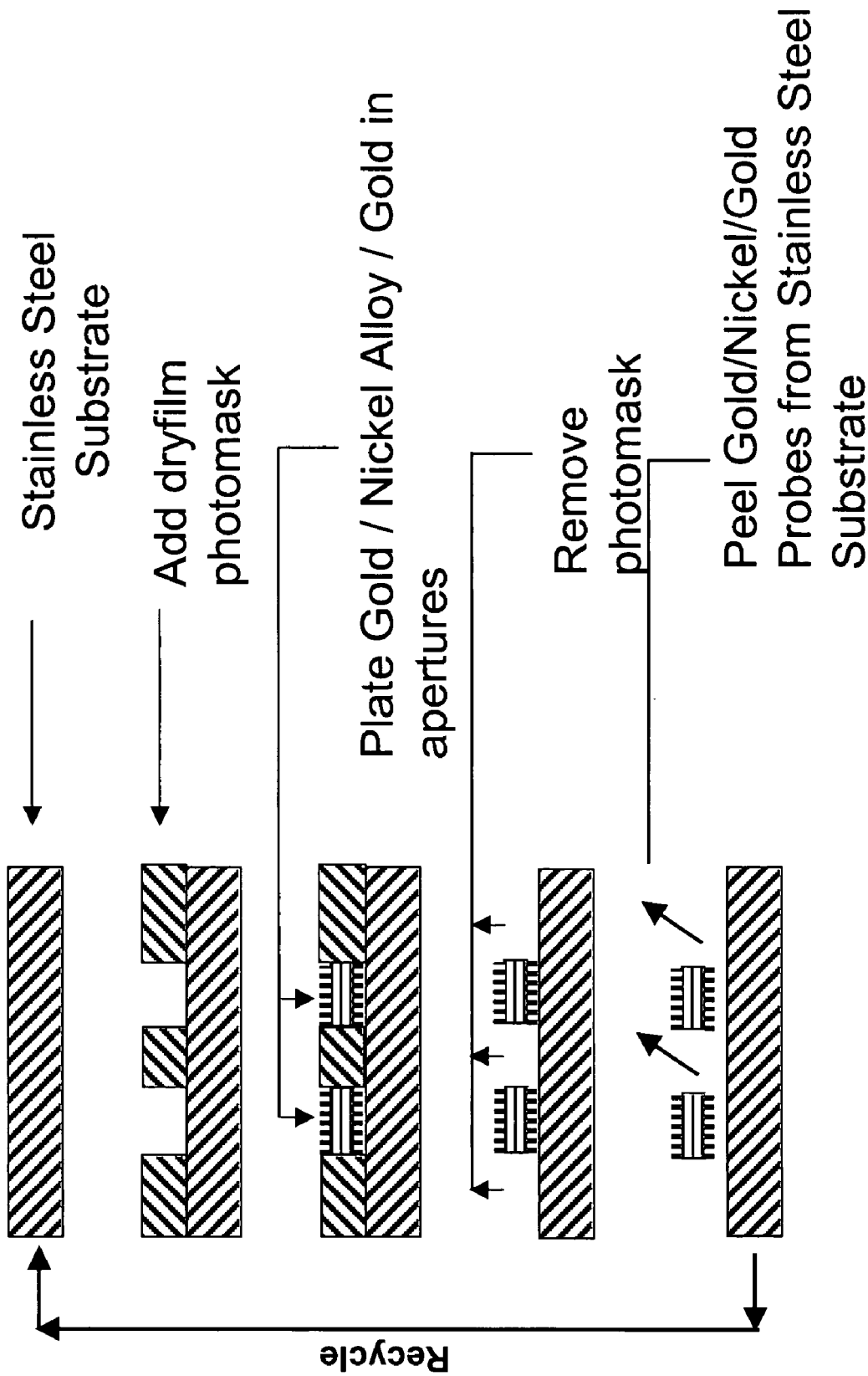
FIG. 2 depicts an approach for fabricating layered probe elements using a reusable substrate, according to one embodiment of the invention.

FIG. 2 depicts an approach for fabricating layered probe elements using a reusable substrate, according to one embodiment of the invention. As depicted in FIG. 2, a dryfilm photomask is applied to the surface of the stainless steel substrate, where the photomask defines apertures. At the next step, a series of conductive materials are plated in the apertures in a layered configuration. In the example depicted in FIG. 2, (a) first gold, (b) then nickel or a nickel alloy, e.g., NiMn, and (c) then gold is plated in the apertures of the photomask. Gold is particularly well suited to such an application because it does not adhere strongly to the stainless steel substrate, and it is also desirably conductive for the finished probe element. At the next step, the photomask is removed, e.g., by immersion in a chemical photoresist stripper. At the next step, the gold-nickel-gold layered probe elements, e.g., configured in a probe panel connected using plated tie bars or the like, are removed from the stainless steel substrate. A release layer does not need to be applied to the surface of the stainless steel substrate. After the probe elements are removed from the substrate, the stainless steel substrate is reusable, as indicated by the recycle annotation. Other materials may also be used for the layered probe element structure including, for example, chromium, palladium, silver, rhodium, or alloys thereof.

Figure 3:
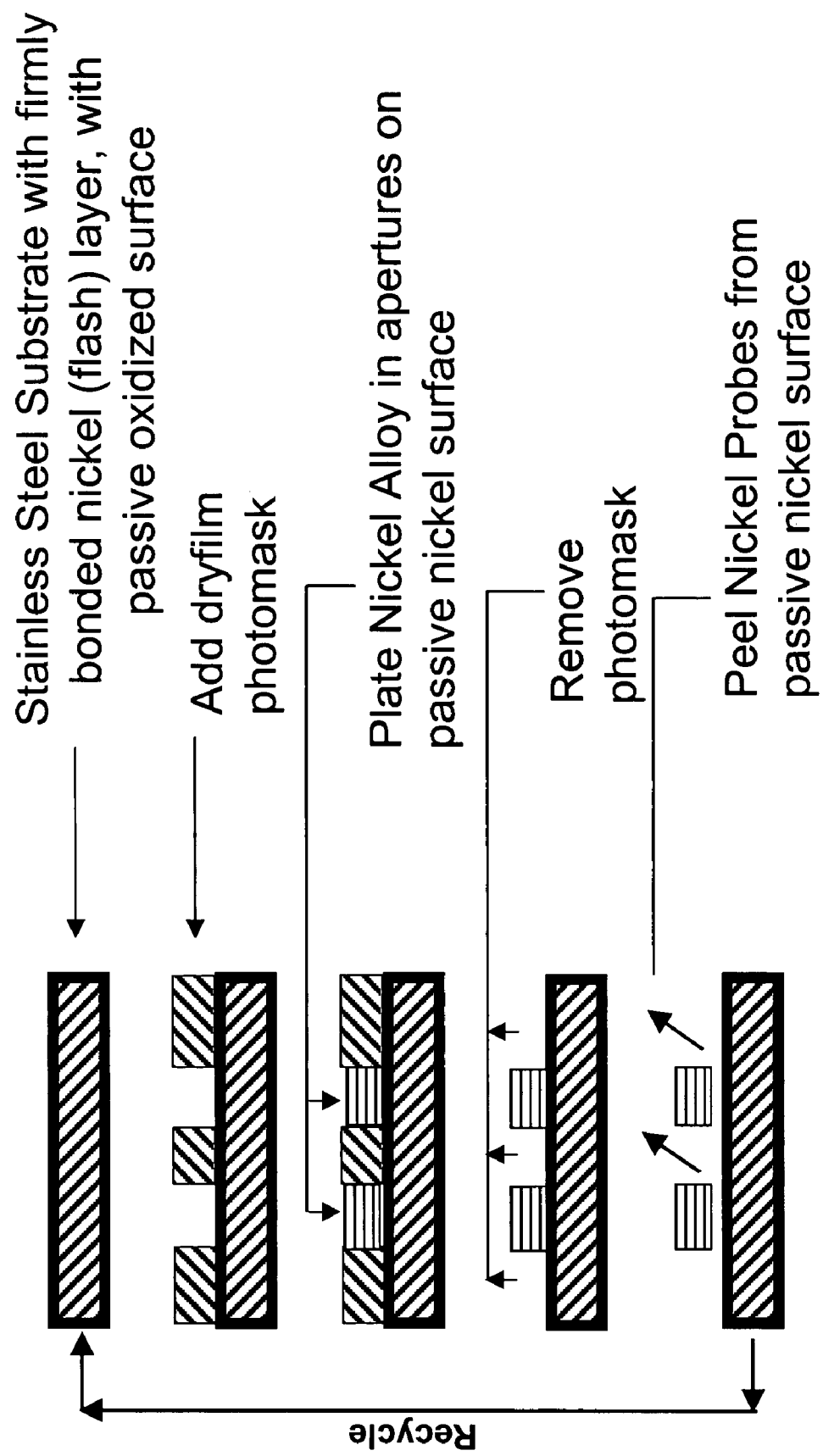
FIG. 3 depicts an approach for fabricating probe elements using a reusable substrate having a passive layer, according to one embodiment of the invention.

FIG. 3 depicts an approach for fabricating probe elements using a reusable substrate having a passive layer, according to one embodiment of the invention. As depicted in FIG. 3, the stainless steel substrate has been bonded with a nickel layer that has been oxidized to have a passive surface. A dryfilm photomask is applied to the surface of the nickel plated stainless steel substrate, where the photomask defines apertures. At the next step, a nickel alloy, e.g., NiMn, or any other suitable conductive material, is plated in the apertures of the photomask. At the next step, the photomask is removed, e.g., by immersion in a chemical photoresist stripper. At the next step, the probe elements, e.g., configured in a probe panel connected using plated tie bars or the like are removed from the nickel plated stainless steel substrate. The passive plated nickel layer does not adhere well to the nickel alloy probe elements, so that they can be readily removed. If it is desired, any bond between the probe elements and the passive plated nickel layer may be broken, for example, thermally or using ultrasonics or the like. After the probe element panel is removed from the substrate, the nickel plated stainless steel substrate is reusable, as indicated by the recycle annotation.

According to one embodiment of the invention, the reusable substrate is prepared prior to the plating of the probe elements. For example, the reusable substrate may be immersed in a cleaner, e.g., an acidic cleaner, followed by rinsing, e.g., deionized water rinsing, and drying.

Regarding the application of the photomask, according to one embodiment of the invention, the image of a probe element may be defined in a photoresist by imaging through a photomask and then developing the image in an appropriate solution to define the apertures for the probe elements. According to one embodiment of the invention, further cleaning of the apertures defined in the photomask is performed. This may be particularly useful in certain applications, such as small probe element geometries.

Although the approach for fabricating probe elements using a reusable substrate is depicted and described herein with reference to specific embodiments, the invention is not intended to be limited to the details depicted in the figures and described herein. Rather, various modifications may be made within the scope and range of equivalents of the claims and without departing from the invention.

What is claimed is:

1. A method for fabricating probes for a probe card assembly, the method comprising:
    forming, on a flat reusable substrate, a metallic layer having a passive oxidized surface;
    forming a first photomask on the passive oxidized surface;
    forming a first plurality of apertures in the first photomask, said first plurality of apertures exposing portions of the passive oxidized surface;
    forming a first plurality of probe elements of a conductive material in the first plurality of apertures and on the passive oxidized surface;
    removing the first photomask from the passive oxidized surface;
    after removing the first photomask, removing the first plurality of probe elements from the passive oxidized surface; then
    forming a second photomask directly on the passive oxidized surface;
    forming a second plurality of apertures in the second photomask, said second plurality of apertures exposing portions of the passive oxidized surface;
    forming a second plurality of probe elements of the conductive material in the second plurality of apertures and on the passive oxidized surface;
    removing the second photomask from the passive oxidized surface; and
    after removing the second photomask, removing the second plurality of probe elements from the passive oxidized surface.

2. The method as recited in claim 1, wherein the forming a first plurality of probe elements in the first plurality of apertures includes forming a first plurality of layered probe elements in the first plurality of apertures, wherein each layered probe element from the first plurality of layered probe elements includes at least two layers of different materials.

3. The method as recited in claim 2, wherein the at least two layers of different materials includes a layer of material formed in between two layers of gold.

4. The method as recited in claim 3, wherein the layer of material comprises one or more of a layer of nickel and a layer of nickel alloy.

5. The method as recited in claim 2, wherein
the flat reusable substrate comprises stainless steel.

6. The method as recited in claim 1, wherein the first and second photomasks comprise first and second dryfilm photomasks.

7. The method as recited in claim 1, wherein the first and second photomasks comprise the same material.

8. The method as recited in claim 1, wherein:
the passive oxidized surface is made of a material that does not adhere well with the first and second pluralities of probe elements.

9. The method as recited in claim 8, wherein the flat reusable substrate comprises stainless steel.

10. The method as recited in claim 8, wherein the metallic layer comprises a layer of oxidized nickel.

11. The method as recited in claim 10, wherein the flat reusable substrate comprises stainless steel.

12. The method as recited in claim 1, further comprising:
prior to forming the first photomask on the reusable substrate, cleaning the passive oxidized layer, and
after removing the first plurality of probe elements and prior to forming the second photomask on the passive oxidized layer, cleaning the passive oxidized layer.

13. The method as recited in claim 1, wherein the conductive material comprises a nickel alloy.

14. The method as recited in claim 13, wherein the conductive material comprises NiMn.

15. The method as recited in claim 1, further comprising after removing the first plurality of probe elements, applying a conductive coating to the first plurality of probe elements.

* * * * *

UNITED STATES PATENT AND TRADEMARK OFFICE
CERTIFICATE OF CORRECTION

PATENT NO. : 7,637,009 B2  Page 1 of 1
APPLICATION NO. : 11/711578
DATED : December 29, 2009
INVENTOR(S) : Keith Heinemann It is certified that error appears in the above-identified patent and that said Letters Patent is hereby corrected as shown below:

Column 4
Claim 1: line 5: Insert --then-- after "surface;".

Claim 1: Line 8: After "surface;" delete "then".

Signed and Sealed this

Ninth Day of March, 2010

David J. Kappos
*Director of the United States Patent and Trademark Office*